US006605996B2

(12) United States Patent
Yu et al.

(10) Patent No.: US 6,605,996 B2
(45) Date of Patent: Aug. 12, 2003

(54) AUTOMATICALLY GAIN CONTROLLABLE LINEAR DIFFERENTIAL AMPLIFIER USING VARIABLE DEGENERATION RESISTOR

(75) Inventors: Hyun Kyu Yu, Taejon (KR); Sang-Gug Lee, Taejon (KR); Mun Yang Park, Taejon (KR); Seong-Do Kim, Taejon (KR); Yong-Sik Youn, Taejon (KR); Seon-Ho Han, Gangwon-Do (KR); Nam-Soo Kim, Seoul (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/039,542

(22) Filed: Dec. 31, 2001

(65) Prior Publication Data

US 2003/0102916 A1 Jun. 5, 2003

(30) Foreign Application Priority Data

Nov. 30, 2001 (KR) ........................ 2001-75186

(51) Int. Cl.[7] ............................... H03F 3/45
(52) U.S. Cl. ................. 330/253; 330/261; 330/283
(58) Field of Search ................ 330/253, 261, 330/283

(56) References Cited

U.S. PATENT DOCUMENTS

| | | | | |
|---|---|---|---|---|
| 4,628,276 A | | 12/1986 | Mizutani | .................. 330/86 |
| 5,384,501 A | * | 1/1995 | Koyama et al. | ............. 327/336 |
| 5,515,003 A | * | 5/1996 | Kimura | ....................... 330/253 |
| 5,572,166 A | | 11/1996 | Gilbert | ....................... 330/254 |
| 5,642,078 A | * | 6/1997 | Navabi et al. | ............... 330/253 |
| 5,990,741 A | * | 11/1999 | Yamamoto et al. | ......... 330/253 |
| 6,052,025 A | * | 4/2000 | Chang et al. | ............... 330/253 |
| 6,218,892 B1 | * | 4/2001 | Soumyanath et al. | .. 257/29.064 |
| 6,278,321 B1 | * | 8/2001 | Franck | ........................ 330/254 |
| 6,316,997 B1 | * | 11/2001 | Tammone, Jr. | .............. 330/254 |

OTHER PUBLICATIONS

IEE 1997, Electronics Letters Online No.:19970686, Apr. 16, 1997, 3 pages.

* cited by examiner

Primary Examiner—Michael Tokar
Assistant Examiner—Khai Nguyen
(74) Attorney, Agent, or Firm—Blakely, Sokoloff, Taylor & Zafman

(57) ABSTRACT

An automatically gain controllable linear differential amplifier using a variable degeneration resistor is disclosed. The linear differential amplifier includes an input end, a bias current source, a load unit, a first MOS transistor and a second MOS transistor. The linear differential amplifiers of the present invention can control an amplifying gain according to an input signal and improve linearity IIP3 without needing additional power consumption caused by improving the linearity. The automatically gain controllable linear differential amplifier uses NMOS/PMOS transistor so an integration process of the amplifier can be implemented more conveniently and efficiently.

8 Claims, 5 Drawing Sheets

AUTOMATICALLY GAIN CONTROLLABLE LINEAR DIFFERENTIAL AMPLIFIER USING VARIABLE DEGENERATION RESISTOR

FIELD OF THE INVENTION

The present invention relates to a linear amplifier; and, more particularly, to an automatically gain controllable linear differential amplifier using a variable degeneration resistor.

DESCRIPTION OF RELATED ARTS

A linear integrated circuit (IC), a typical analog IC can have output signals, which is varying continuously, in proportion to an input signal level. The linear integrated circuit, theoretically, can generate unlimited numbers of variety states of the signal.

A linear amplifier can be described linear input to output relation, which is linear transfer function. The linear amplifier for a low frequency input is commonly used for an audio amplifier and a linear amplifier for a high frequency input is commonly used for various transceiver systems.

Typically, the linear amplifier for a high frequency input signal requires high gain but linearity is not much important when the input signal is low, however, when the input signal is high, the linear amplifier for a low frequency input signal requires reasonable gain but linearity is very important.

In case the linear amplifier is used for a communication transceiver, if the linear amplifier has non-linearity with high frequency input, then output signals may be distorted and receiving sensitivity may be decreased by the harmonics. The receiving sensitivity may also be decreased when an amplifying gain of the linear amplifier is too small.

The harmonics are generated due to an internal trans conductance value of a Metal Oxide Semiconductor (MOS) transistor which has the non-linear characteristic in the linear amplifier having transistors. Also, the harmonics are induced by connecting a collector and an emitter at a base in a bipolar transistor.

The bipolar transistor is composed of two diodes coupled each other and has a non-linear characteristic of an output current according to an input voltage.

An output signal of an active element including a MOS transistor and an Operational Amplifier (OP-AMP) can be expressed by an equation as follow:

$$vo = \alpha 1.vi + \alpha 2.vi^2 + \alpha 3.vi^3 + \ldots \quad \text{Eq.(1)}$$

where, vo represents an output signal and vi represents an input signal and $\alpha 1$, $\alpha 2$ and $\alpha 3$ are coefficients defining the linearity of active elements. Ideal active elements have "0" as the coefficients $\alpha 2$ and $\alpha 3$ so an output signal of the ideal active elements is a value simply scaled by $\alpha 1$. However, active elements generally have some value for coefficients $\alpha 2$ and $\alpha 3$ thus the active elements have a non-linearity by coefficients $\alpha 2$ and $\alpha 3$. The coefficient $\alpha 2$ defines a quantity of a non-linearity of the quadratic term and the coefficient $\alpha 3$ defines a quantity of the non-linearity of a cubic term.

Higher terms of Eq.(1) $\alpha 2.vi^2 + v3.vi^3$ is a signal having similar frequency to an input signal by the non-linearity of the active elements and it causes inter-modulating the signal with the input signal. As a result, an un-wanted output signal is generated. Inhere, an Input referred $3^{rd}$-order Intercept Point (IIP3) is a input power with a unit "dBm" when a power of the harmonics generated by third term of Eq. (1) $\alpha 3.vi$ becomes identical to the input signal. If the current of input signal is lower than the IIP3, then the active elements amplify the harmonics more than the input signal. Therefore, a signal/noise ratio (S/N) will be worse. In other words, the IPP3 can be used as a reference for determining the linearity of the amplifier.

Referring to Eq. (1), the value of the higher term of the equation 1 $\alpha 2.vi^2 + \alpha 3.vi^3$ is increasing rapidly comparing to the input signal so the harmonics is will be increasing rapidly too. Therefore, the harmonics needs to be controlled and decreased effectively. If the harmonics cannot be controlled, the harmonics will be increased by the higher terms of Eq. (1) more than the input signal so the noise will be amplified more than the input signal.

Therefore, the transceiver system, which generates the harmonics, needs an amplifier that can control the gain of the amplifier according to a value of the signal and has the enhanced linear characteristics when the gain is so small.

FIG. 1 is a circuit diagram of a conventional linear differential amplifier.

Referring to FIG. 1, the conventional linear differential amplifier includes loads 10 and 11, bias current sources 40 and 41, NMOS transistors 20, 21 and degeneration resistor 30. The loads 10 and 11 are provided between an applied power $V_{DD}$ and an output end $V_{out}-$ and between the applied power $V_{DD}$ and an output end $V_{out}+$. The load can be a resistor, a capacitor or an inductor. The load also can be an alternate resistor, which is a mixture of a capacitor and an inductor. The bias current sources 40 and 41 are connected to a ground. The NMOS transistor 20 is connected between the bias current source 40 and output end $V_{out}-$ and the NMOS transistor 21 is connected between the bias current source 41 and the output end $V_{out}+$. The NMOS transistors have differential input signal V+ and V− as inputs of their gates. An end of the degeneration resistors are connected at a connection point between the bias power source 40 and another end of the NMOS transistor 20 and a connection point between the bias power source 41 and the NMOS transistor 21. The degeneration resistor can be implemented as variety form, however, in an integration process of a conventional CMOS processing, a polysilicon-resistor is used for the degeneration resistors because of characteristics of the polysilicon-resistor such as an excellent linearity and small a parasitic capacitance.

Operations of the conventional linear differential amplifier will be described below in detail.

When the differential input signal V+ and V− is not applied to gates of the NMOS transistors 20 and 21, currents of $I_1$ and $I_2$ have identical value $I_{B1}(=I_{B2})$ by the bias current sources 40 and 41.

In a meantime, if the differential input signal V+ has a higher electric potential level than the differential input signal V−, an electric potential level of the negative output end $V_{out}-$ is higher than an electric potential level of the positive output end $V_{out}+$ by a current difference between two loads 10 and 11.

If the degeneration resistor 30 is connected to the NMOS transistors 20 and 21, then a virtual ground is formed and the harmonics, which has the linearity among signals flowed at the NMOS transistors 20 and 21, are cancelled each other. Therefore, the linearity of the linear differential amplifier will be improved. Inhere, the harmonics IIP3 is outputted from the NMOS transistors 20 and 21 by an amplified signal of the differential input signal V+ and V− and non-linearity of the NMOS transistors 20 and 21. At this point, phase of the differential input signal V+ and V− are reversed but the harmonics generated by the non-linearity of the NMOS transistors 20 and 21 has variety phases. Therefore, the linearity of the amplifier is improved by canceling a part of the harmonics, which is generated in response to the different input signal V+ and V−.

However, the above-mentioned conventional linear differential amplifier using the degeneration resistor 30 has a fixed resistor value thus the gain cannot be controlled and there is a limitation for improving the linearity when the electric potential level of the differential input signal is higher. Also, it is very difficult to integrate the degeneration resistor using the polysilicon-resistor in a CMOS process.

FIG. 2 is a circuit diagram of another conventional linear differential amplifier.

Referring to FIG. 2, the conventional linear differential amplifier has the same structure except a NMOS transistor 50 used instead of the degeneration resistor 30 in FIG. 1.

By using the NMOS transistor 50 as a resistor, the conventional linear differential amplifier in FIG. 2 improves the problem of the conventional linear differential amplifier in FIG. 1, which is difficulty of the integration of the polisilicon degeneration resistor in the CMOS process. If a constant voltage $V_B$ is applied to the gate of the NMOS transistor 50 then the NMOS transistor 50 will be operated as a resistor.

However, a resistor value of the NMOS transistor 50 is not stable when the electric potential level of the differential input signals V+ and V− are increasing. If the electric potential level of the differential input signals V+ and V− are increased, then a current outputted from source/drain ends of the NMOS transistor 50 is increased too. At this point, since the gate voltage $V_B$ has a steady value, the value of the differential input signal V+ and V− will be increased. Therefore, the value of the NMOS transistor 50 will be unstable according to increasing the value of the differential input signals V+ and V−. Since the differential input signals V+ and V− are changed, the value of the IIP3 is not improved. Additionally, the linearity of the amplifier becomes worse by the non-linearity of the NMOS transistor 50. The non-linearity of the NMOS transistor causes the value of the differential input signals V+ and V− larger. The large value of the differential input signals V+ and V− will cause the linearity of the amplifier worse.

FIG. 3 is a circuit diagram of another conventional linear differential amplifier.

Referring to FIG. 3, the conventional linear differential amplifier uses two transistors 60 and 61 instead of the NMOS transistor 50 in the FIG. 2. Sources and drains of the two NMOS transistors 60 and 61 are connected each other so that the source of one transistor is connected to the drain of the other. The two NMOS transistors 60 and 61 are controlled by an input signal V+ and input signal V− as a gate input.

Referring to FIG. 3, the conventional linear differential amplifier improves an unstable resistor value of the NMOS transistor 50, which is a problem of the conventional linear differential amplifier in FIG. 2. The NMOS transistors 60 and 61 maintains a stable resistor value in spite of alternating the potential level of the differential input signal V+ and V− since the NMOS transistors 60 and 61 use the differential input signal V+ and V− as the gate voltage. In other words, if the potential level of the differential input signal V+ is increased and the differential input signal V− is decreased then the resistor value of the NMOS transistor 60 will be decreased and the resistor value of the NMOS transistor 61 will be increased. The two NMOS transistors 60 and 61 are connected in parallel so the resistor value can be maintained at a certain level.

However, the above-mentioned conventional linear differential amplifiers in FIGS. 1, 2 and 3 cannot control an amplifying gain, therefore, the IIP3 can not be improved when the potential level of the differential input signal is alternated.

SUMMARY OF THE INVENTION

It is, therefore, an object of the present invention to provide a linear differential amplifier for minimizing non-linearity of harmonics and controlling an amplifying gain.

In accordance with an aspect of the present invention, there is provided the linear differential amplifier including: input unit for receiving a positive input signal and a negative input signal; a bias current source connected to one end of the input unit, for providing a bias current; load unit connected to another end of the input unit, for providing an output level difference between a positive output unit and a negative output unit corresponding to the positive input signal an the negative input signal; a first MOS transistor coupled between the bias current source and the input unit, having the positive input signal as a gate input and using a gain control signal as a circuit board bias voltage; and a second MOS transistor coupled between the bias current source and the input unit, having the negative input signal as a gate input and using the gain control signal as a circuit board bias voltage.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 1:
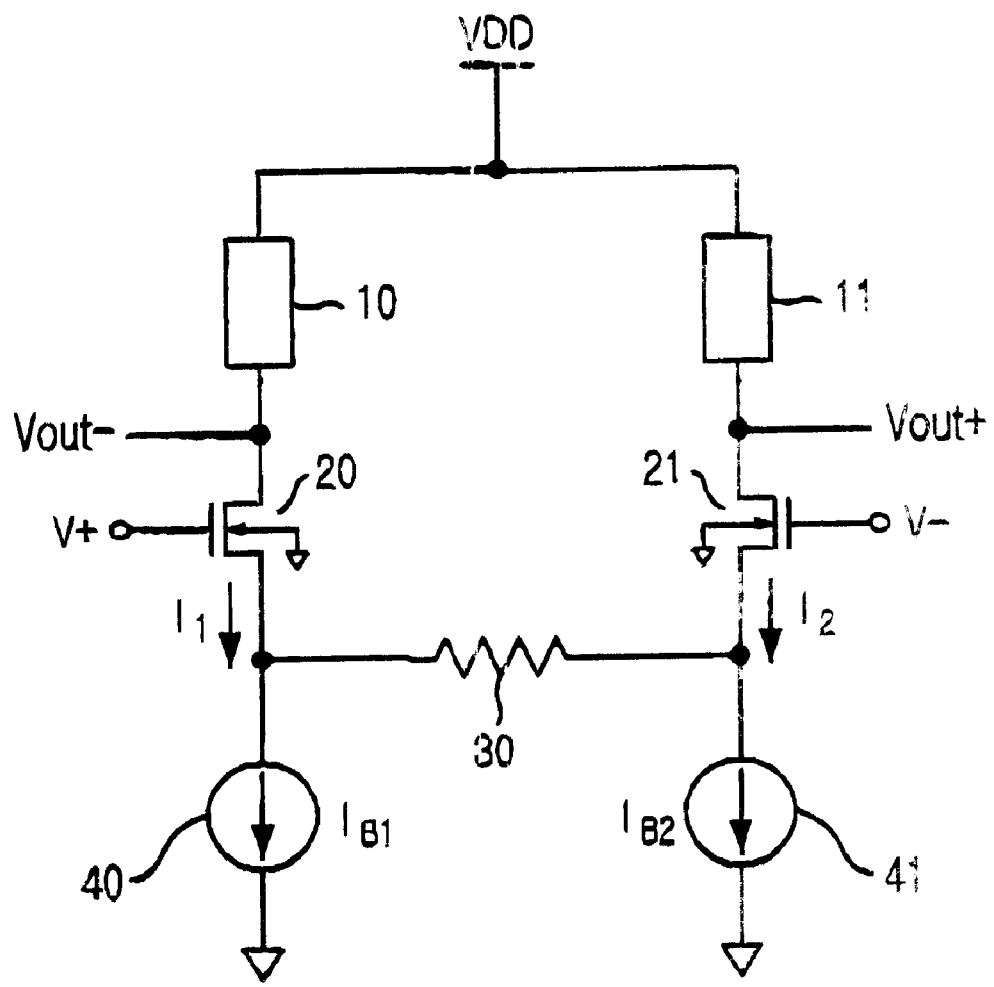
FIG. 1 is a circuit diagram of a conventional linear differential amplifier.
Figure 2:
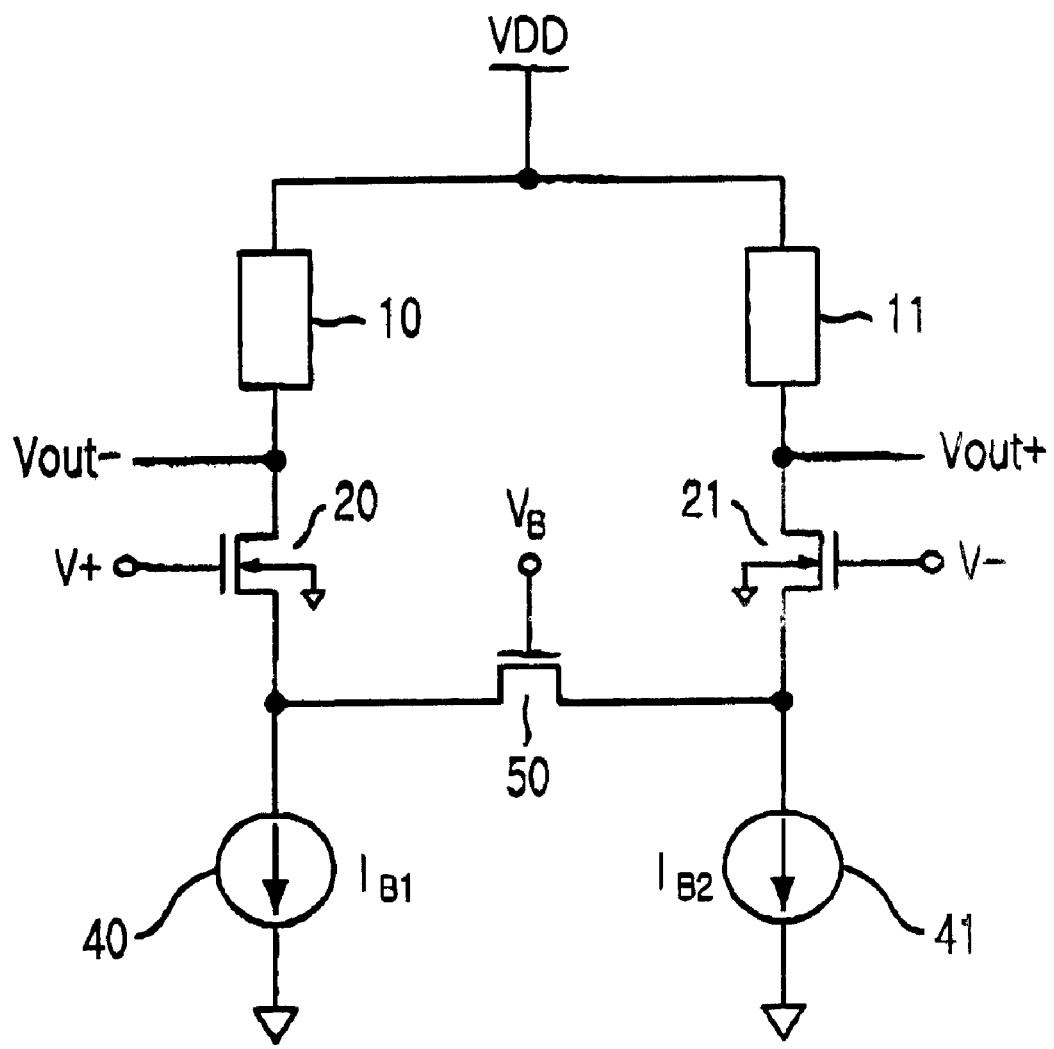
FIG. 2 is a circuit diagram of another conventional linear differential amplifier.
Figure 3:
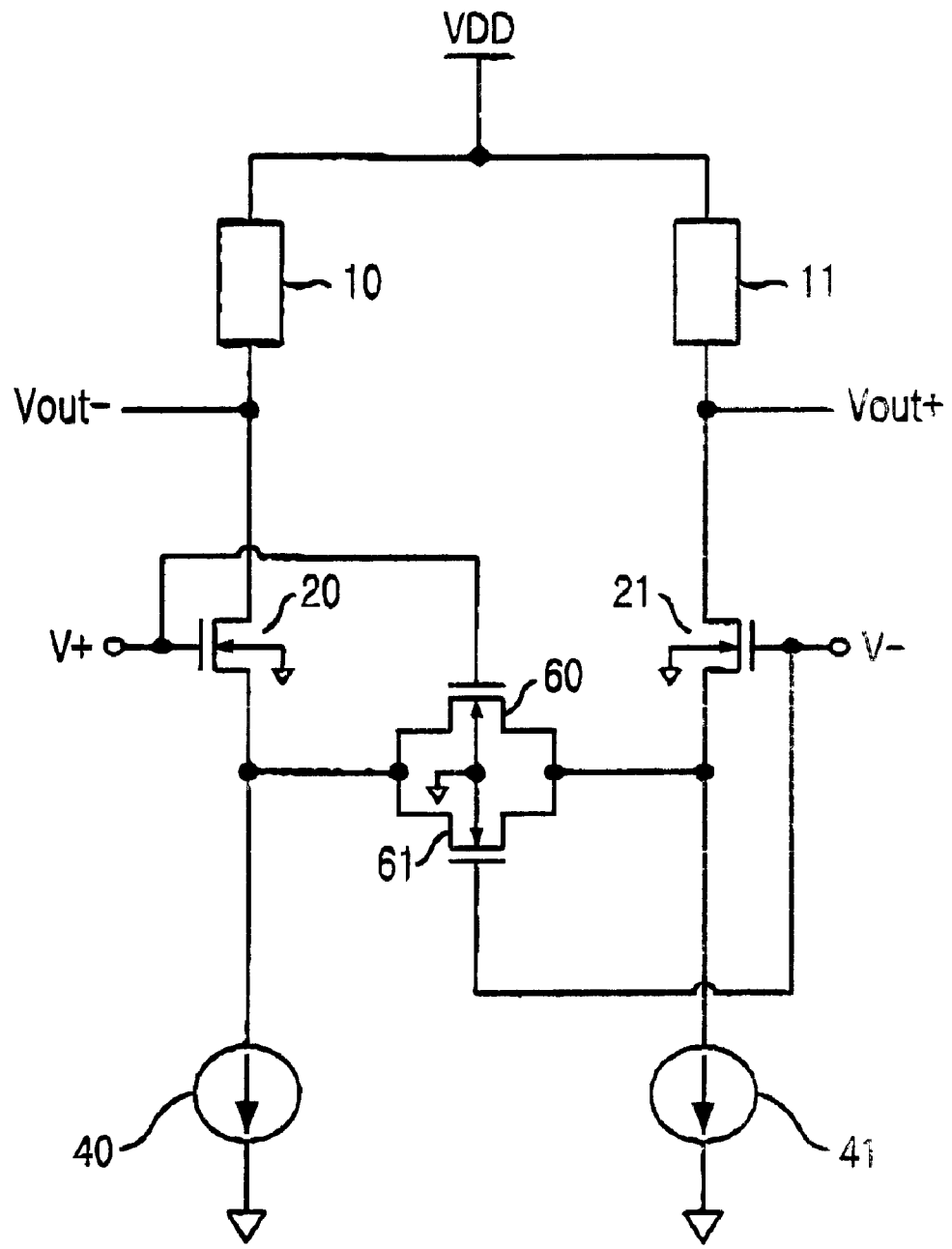
FIG. 3 is a circuit diagram of another conventional linear differential amplifier.
Figure 4:
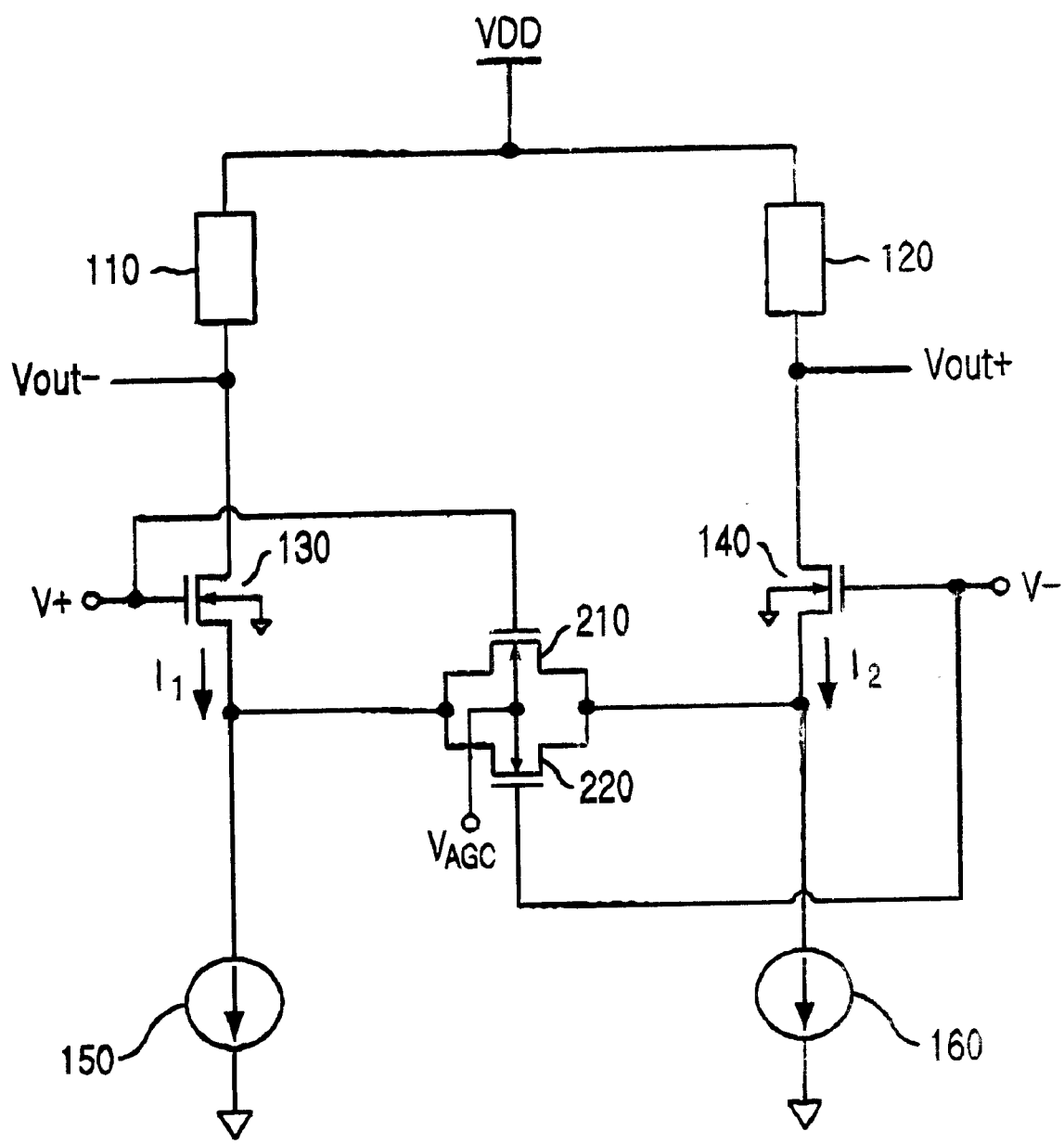
FIG. 4 is a circuit diagram of a linear differential amplifier in accordance with a preferred embodiment of the present invention.

FIG. 4 is a circuit diagram of a linear differential amplifier in accordance with the preferred embodiment of the present invention.

Referring to FIG. 4, the linear differential amplifier of the present invention includes loads 110 and 120, bias current sources 150 and 160, NMOS transistors 130 140 210 and 220. The loads 110 and 120 are located between an applied power $V_{DD}$ and output ends $V_{out}-$ and $V_{out}+$. The current sources 150 and 160 are connected to a ground end. The NMOS transistors 130 and 140 are connected between the bias current source and the output ends and have the differential input signals as inputs of their gates. The NMOS transistors 210 and 220 are connected between connection parts of the bias current sources 150 and 160 and the NMOS transistors 130 and 140. The NMOS transistors 210 and 220 are connected to each other so that the source of one transistor is connected to the drain of the other. The NMOS transistor 210 receives an input signal V+ at a gate and the NMOS transistor 220 has an input signal V− as a gate input. Additionally, the NMOS transistors 210 and 220 receive a gain control signal $V_{AGC}$ as a circuit board bias voltage through a p-Well.

Operations of the linear differential amplifier of the present invention will be described as follows.

At first, currents $I_1$ and $I_2$, which are flowed through the NMOS transistor 130 and 140, have identical value $I_{B1}$(= $I_{B2}$) by the bias current source 150 and 160 when the differential input signals $V_+$ and $V_-$ are not applied to a gates of the NMOS transistor 130 and 140.

At this point, if one differential input signal V+, which is applied to the gate of the NMOS transistor 130, has a higher electric potential level than the other differential input signal V−, which is applied to the gate of the NMOS transistor 140, then the electric potential level of the negative output end $V_{out}$+ becomes higher than a electric potential level of the positive output end $V_{out}$+ by a difference between currents at two loads 110 and 120.

In here, the loads 110 and 120 can be replaced by a resistor, a capacitor, or an inductor. Additionally, the loads 110 and 120 can be an alternate resistor, which is a mixture of a resistor, a capacitor and an inductor.

The differential input signal V+ is applied to the gate of the NMOS transistor 120 and the differential input signal V− is applied to the gate of the NMOS transistor 220 therefore, the resistance of the NMOS transistor 210 becomes decreased and the resistance of the NMOS transistor 220 becomes increased.

Hence, a degeneration resistor, which is composed of the NMOS transistors 210 and 220, maintains a steady resistor value.

In a meantime, a resistor value of the NMOS transistors 210 and 220 becomes alternated by a gain voltage signal. The threshold voltage of the NMOS transistor 210 and 220 is varied by the gain voltage signal $V_{AGC}$ applied to a circuit board bias of the NMOS transistors 210 and 220 changes, thereby changing the resistor value of the NMOS transistors 210 and 220. The threshold voltage changes the resistor value of the NMOS transistors 210 and 220.

If the potential level of the gain control signal $V_{AGC}$ becomes higher, then the threshold voltage of the NMOS transistors 210 and 220 becomes increased and if the potential level becomes lower, then the threshold voltage becomes decreased.

It can be expressed as follow:

$$Rds = \frac{1}{\mu n \cdot Cox \cdot (VGS - VTH)} \quad \text{Eq. (2)}$$

where, Rds is a resistance value between a drain and a source of the NMOS transistors 210 and 220. μn is a mobility of an electronic and Cox is an oxide capacitance. Rds is expressed by function Vgs, which is a voltage between a gate to a source, and threshold voltage (Vth)

Referring to Eq. (2), the Rds is changed by the Vth. The Vth is calculated by a function of a body voltage of the NMOS transistors 210 and 220. The function of the body voltage is alternated by the gain control signal ($V_{AGC}$).

The linear differential amplifier in FIG. 4 is an amplifying gain controllable linear amplifier using a variable degeneration resistor. The linear differential amplifier of the present invention can control the gain of the amplifier according to the differential input signal in case the differential input signals V+ and V− are widely alternated, which can be happened in the wireless communication system. In the wireless communication system, a current of an applied signal is changed widely.

If the linear amplifier of the present invention is used with a detector, which detects a power of the differential input signals V+ and V−, then the gain can be controlled by receiving a possible detection signal from the detector or receiving an output signal of a conventional automatic gain control circuit, which detects an output of the amplifier and feeds back the detected signal.

Hence, the resistance value of the NMOS transistors 210 and 220, which is used as the degeneration resistor, is decided by the gain control signal $V_{AGC}$. The NMOS transistors 210 and 220 maintain the decided resistance value at a certain level. Therefore, the linear amplifier of the present invention can have an excellent linearity in spite of altering a current level of the differential input signals V+ and V−.

Additionally, the Input referred $3^{rd}$-order Intercept Point IIP3 can be improved by improving the linearity of the differential input signals V+ and V−. The non-linearity of the amplifier can restraint generation of the high order harmonics. The high order harmonics gives bad affect to IIP3. The IIP3 represents a power of the differential input signal V+ and V− by a unit "dBm" when the $3^{rd}$ order harmonics and the differential input signals V+ and V− becomes identical. If the current of the $3^{rd}$ order harmonics becomes higher than the current of the differential input signals V+ and V−, then a receiver sensitivity of the linear amplifier becomes decreased.

In a meantime, the NMOS transistors 130, 140, 210 and 220 need to be separately implemented at a P-well in a semiconductor process. The NMOS transistors 210 and 220 need to be implemented at a p-well, in which the gain control signal is applied as a back bias. The NMOS transistors 130 and 140 need to be implemented at a p-well, in which the gain control signal is not applied as a back bias so the gain control signal needs to be applied independently to a circuit board bias. Therefore, the linear differential amplifier of FIG. 4 needs two P-wells. Typically, it can be implemented by a twin-well process.

Figure 5:
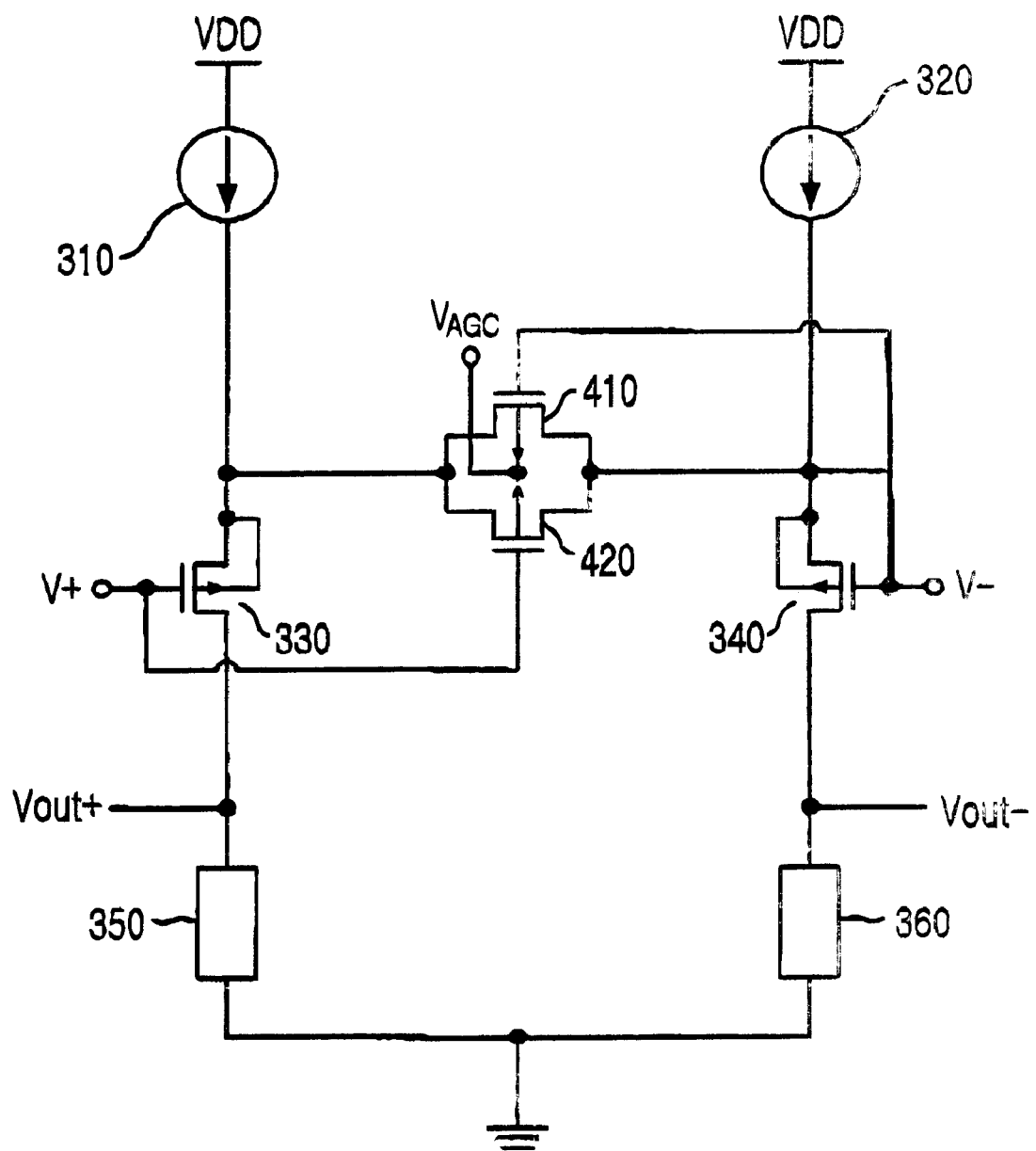
FIG. 5 is a circuit diagram of a linear differential amplifier with PMOS transistors.

FIG. 5 is a circuit diagram of a linear differential amplifier with PMOS transistors.

Referring to FIG. 5, the linear differential amplifier has the similar structure of the linear differential amplifier in FIG. 4 except PMOS transistors used instead of NMOS transistors 130, 140, 210 and 220 in FIG. 4.

The linear differential amplifier in FIG. 5 includes loads 350 and 360, bias current sources 310 and 320 and PMOS transistors 330, 340, 410 and 420. The loads 350 and 360 are applied between an output end and a ground. The bias current source 310 and 320 are connected to an applied power $V_{DD}$. The NMOS transistors 330 and 340 are connected between the bias current source 310 and 320 and output ends $V_{out}$+ or $V_{out}$− and have the differential input signals V+ and V− as inputs of the their gates. The NMOS transistors 410 and 420 are connected at connection part of the bias current sources 310 and 320 and the NMOS transistors 330 and 340. The NMOS transistors 410 and 420 are connected each other so that the source of one transistor is connected to the drain of the other.

The linear differential amplifier in FIG. 5 has similar structure and an operation method but the PMOS transistors are used instead of the NMOS transistors in FIG. 4. In an integration process, the PMOS transistors can be implemented by using N-type semiconductor circuit board. The linear differential amplifier in FIG. 5 can be formed by N-Well process instead of a Twin-Well process for the amplifier in FIG. 4.

The linear differential amplifier in FIG. 5 has the same operation results of the amplifier in FIG. 4, therefore, detailed description will be skipped.

The linear differential amplifiers in accordance with the preferred embodiments of the present invention can control the amplifying gain according to the input signal applied to a differential amplifier, therefore, the present invention improves linearity of the IIP3 and doesn't need additional power consumption for improving the linearity. The present invention uses NMOS/PMOS transistor instead of the polysilicon-resistor. By replacing the polysilicon-resistor with NMOS/PMOS transistors, an integration process of the amplifier can be implemented more conveniently and efficiently.

While the present invention has been described with respect to certain preferred embodiments, it will be apparent to those skilled in the art that various changes and modifications may be made without departing from the scope of the invention as defined in the following claims.

What is claimed is:

1. A linear differential amplifier, comprising:
   input means for receiving a positive input signal and a negative input signal;
   a bias current source connected to one end of said input means, for providing a bias current;
   load means connected to another end of said input means, for providing an amplified difference output signal, wherein the amplified difference output signal represents a difference between the positive amplified input signal and the negative amplified input signal; and
   a degeneration resistor for maintaining a steady resistance value for the bias current source in response to the positive input signal and the negative input signal, wherein the degeneration resistor includes:
      a first MOS transistor coupled between said bias current source and said input means for receiving the positive input signal as a gate input and using a gain control signal as a circuit board bias voltage;
      a second MOS transistor coupled between said bias current source and said input means for receiving the negative input signal as a gate input and using the gain control signal as a circuit board bias voltage; and
      control means for generating the gain control signal.

2. The linear differential amplifier as recited in claim 1, wherein said load means is connected to a supplied power and said bias current source is connected to a ground.

3. The linear differential amplifier as recited in claim 1, wherein said input means includes:

a third MOS transistor coupled between said load means and said bias current source, having the positive input signal as a gate input; and
   a fourth MOS transistor coupled between said load means and said bias current source, having the negative input signal as a gate input.

4. The linear differential amplifier as recited in claim 1, wherein the gain control signal is applied to first well of said first and second MOS transistors as a back bias.

5. The linear differential amplifier as recited in claim 3, wherein the gain control signal is applied to second well of said first and second transistors as a back bias.

6. A linear differential amplifier for amplifying a difference between a positive input signal and a negative input signal to generate an amplified difference output signal, comprising:
   a first amplifier for receiving the positive input signal to generate an amplified positive input signal;
   a second amplifier for receiving the negative input signal to generate an amplified negative input signal;
   first and second bias current source, each connected to one end of said each first and second amplifiers, for providing a bias current;
   first and second output loads, each connected to another end of the first and second amplifiers for providing an amplified difference output signal, wherein the amplified difference output signal represents a difference between the positive amplified input signal and the negative amplified input signal; and
   a degeneration resistor for maintaining a steady resistance value for the bias current sources in response to the positive input signal and the negative input signal, wherein the degeneration resistor includes:
      a first MOS transistor having a first drain/source coupled between the first amplifier and the first current source, a second drain/source coupled between the second amplifier and the second current source and a gate for receiving the positive input signal;
      a second MOS transistor having a first drain/source coupled between the first amplifier and the first current source, a second drain/source coupled between the second amplifier and the second current source and a gate for receiving the negative input signal; and
      control means for generating a gain control signal to be commonly to the gates of the first and second MOS transistors.

7. The linear differential amplifier as recited in claim 6, wherein the gain control signal is applied to first well of the first and second MOS transistors as a back bias.

8. The linear differential amplifier as recited in claim 6, wherein the gain control signal is applied to second well of the first and second transistors as a back bias.

* * * * *